United States Patent
Larson et al.

(10) Patent No.: US 12,092,909 B2
(45) Date of Patent: Sep. 17, 2024

(54) INTEGRATED SEMICONDUCTOR LASER WITH INTERFEROMETRIC AMPLIFIER ARRAY

(71) Applicant: Lumentum Operations LLC, San Jose, CA (US)

(72) Inventors: Michael C. Larson, Oakland, CA (US); Shibnath Pathak, San Jose, CA (US); Barrie P. Keyworth, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 627 days.

(21) Appl. No.: 16/789,678

(22) Filed: Feb. 13, 2020

(65) Prior Publication Data

US 2021/0063776 A1    Mar. 4, 2021

Related U.S. Application Data

(60) Provisional application No. 62/895,399, filed on Sep. 3, 2019.

(51) Int. Cl.
*G02F 1/01* (2006.01)
*G01S 7/4861* (2020.01)
*G02F 1/225* (2006.01)
*H01S 5/50* (2006.01)

(52) U.S. Cl.
CPC .......... *G02F 1/0123* (2013.01); *G01S 7/4861* (2013.01); *G02F 1/2252* (2013.01); *H01S 5/50* (2013.01)

(58) Field of Classification Search
CPC .... G02F 1/0123; G02F 1/2252; G01S 7/4861; H01S 5/50
See application file for complete search history.

(56) References Cited

U.S. PATENT DOCUMENTS

| | | | | |
|---|---|---|---|---|
| 6,208,454 | B1 * | 3/2001 | Koren | G02F 2/004 359/332 |
| 6,334,005 | B1 * | 12/2001 | Burie | G02F 1/225 385/9 |
| 6,522,462 | B2 * | 2/2003 | Chu | G02B 6/26 359/344 |
| 6,563,627 | B2 * | 5/2003 | Yoo | G02F 2/004 359/332 |

(Continued)

OTHER PUBLICATIONS

Hassan Termos. Study of up & down conversion technique by all-optical sampling based on SOAMZI. Other. Université de Bretagne occidentale—Brest, 2017. English. <NNT : 2017BRES0021>. <tel-01719092v2> (Year: 2017).*

(Continued)

*Primary Examiner* — Peter Radkowski
(74) *Attorney, Agent, or Firm* — Harrity & Harrity, LLP

(57) ABSTRACT

An optical device may comprise a laser configured to generate an optical beam and a Mach-Zehnder Interferometer (MZI) configured to amplify the optical beam. The MZI may comprise a first coupler and a second coupler connected via a plurality of arms of the MZI. An arm, of the plurality of arms, may provide an optical path for part of the optical beam and may comprise a semiconductor optical amplifier (SOA) configured to amplify the part of the optical beam and a phase shifter configured to adjust a phase of the part of the optical beam.

20 Claims, 9 Drawing Sheets

(56) References Cited

U.S. PATENT DOCUMENTS

| | | | | |
|---|---|---|---|---|
| 6,614,582 | B1* | 9/2003 | Mikkelsen | H04B 10/299 398/175 |
| 6,727,991 | B2* | 4/2004 | Martinez | H04B 10/299 356/477 |
| 6,836,357 | B2* | 12/2004 | Wang | H01S 5/50 359/344 |
| 7,633,988 | B2* | 12/2009 | Fish | G02F 1/225 372/50.1 |
| 7,733,923 | B2* | 6/2010 | Doerr | H01S 5/026 372/18 |
| 8,295,315 | B2* | 10/2012 | Ward | H01S 5/06256 372/102 |
| 8,401,399 | B2* | 3/2013 | Barton | H04B 10/801 398/201 |
| 8,571,084 | B2* | 10/2013 | Docter | H01S 5/06256 372/50.122 |
| 8,588,612 | B2* | 11/2013 | Park | H04B 10/2587 398/58 |
| 8,605,766 | B2* | 12/2013 | Dallesasse | H01S 5/021 372/20 |
| 8,718,486 | B2* | 5/2014 | Barton | G02B 6/125 398/201 |
| 9,209,606 | B2* | 12/2015 | Adams | H01S 5/0265 |
| 9,270,380 | B2* | 2/2016 | Barton | G02F 1/2255 |
| 9,312,662 | B1* | 4/2016 | Larson | G02B 6/29352 |
| 9,344,196 | B1* | 5/2016 | Mashanovitch | H04B 10/5561 |
| 9,722,397 | B2* | 8/2017 | Takabayashi | H01S 5/142 |
| 9,793,684 | B2* | 10/2017 | Takabayashi | H01S 5/4025 |
| 9,874,800 | B2* | 1/2018 | Nagarajan | G02F 1/0121 |
| 9,887,780 | B2* | 2/2018 | Barton | H04B 10/505 |
| 9,941,971 | B1* | 4/2018 | Mashanovitch | H04B 10/5161 |
| 2002/0181087 | A1* | 12/2002 | Martinez | H04L 7/0075 359/344 |
| 2002/0186453 | A1* | 12/2002 | Yoo | G02F 2/004 359/326 |
| 2003/0002797 | A1* | 1/2003 | Chu | G02B 6/29352 359/344 |
| 2003/0067676 | A1* | 4/2003 | Wang | H01S 5/50 359/344 |
| 2005/0025419 | A1* | 2/2005 | Fish | G02B 6/12004 385/31 |
| 2007/0133632 | A1* | 6/2007 | Doerr | H01S 5/026 372/18 |
| 2009/0116835 | A1* | 5/2009 | Kwon | G02B 6/356 398/48 |
| 2010/0142567 | A1* | 6/2010 | Ward | H01S 5/4062 372/20 |
| 2010/0303462 | A1* | 12/2010 | Park | H04B 10/2587 398/65 |
| 2010/0303469 | A1* | 12/2010 | Barton | H04B 10/6151 29/428 |
| 2011/0216789 | A1* | 9/2011 | Docter | H01S 5/06256 372/20 |
| 2012/0057609 | A1* | 3/2012 | Dallesasse | H01S 5/141 372/20 |
| 2013/0148982 | A1* | 6/2013 | Barton | H04B 10/516 398/185 |
| 2014/0356001 | A1* | 12/2014 | Barton | H04B 10/505 398/183 |
| 2014/0362433 | A1* | 12/2014 | Adams | H01S 5/0265 359/344 |
| 2016/0094017 | A1* | 3/2016 | Larson | H01S 5/06256 359/344 |
| 2016/0156149 | A1* | 6/2016 | Takabayashi | H01S 5/142 372/6 |
| 2016/0344480 | A1* | 11/2016 | Barton | G02B 6/125 |
| 2016/0363835 | A1* | 12/2016 | Nagarajan | G02F 1/225 |
| 2017/0098921 | A1* | 4/2017 | Takabayashi | H01S 5/02251 |

OTHER PUBLICATIONS

Zou et al., Integrated Microwave Photonics: A Multifunctional Photonic Integrated Circuit for Diverse Microwave Signal Generation, Transmission, and Processing (Laser Photonics Rev. 13(6)/ 2019) (Year: 2019).*

Bogaerts, Wim, Introduction To Silicon Photonics Circuit Design, Short Course 454 -OFC 2018. (Year: 2018).*

Tekin, Tolga, Monolithically Integrated Gain Shifted Mach-Zehnder Interferometer for All-Optical Demultiplexing, Dissertation, Fraunhofer Institute for Reliability and Microintegration IZM (Year: 2004).*

Durhuus, T., Jørgensen, C., Mikkelsen, B., Pedersen, R. J. S., & Stubkjær, K. (1994). All optical wavelength conversion by SOA's in a Mach-Zehnder configuration. I E E E Photonics Technology Letters, 6(1), 53-55. DOI: 10.1109/68.265887 (Year: 1994).*

Williams, Ryan Daniel, Photonic integrated circuits for optical logic applications, Dissertation, MIT, Dept. of Materials Science and Engineering, http://hdl.handle.net/1721.1/42025; 2007 (Year: 2007).*

Dagens et al., "Multiwaveguide SOA for increased saturation power without noise penalty," Electronic Letters, vol. 35, No. 6, Mar. 18, 1999, pp. 485-486.

* cited by examiner

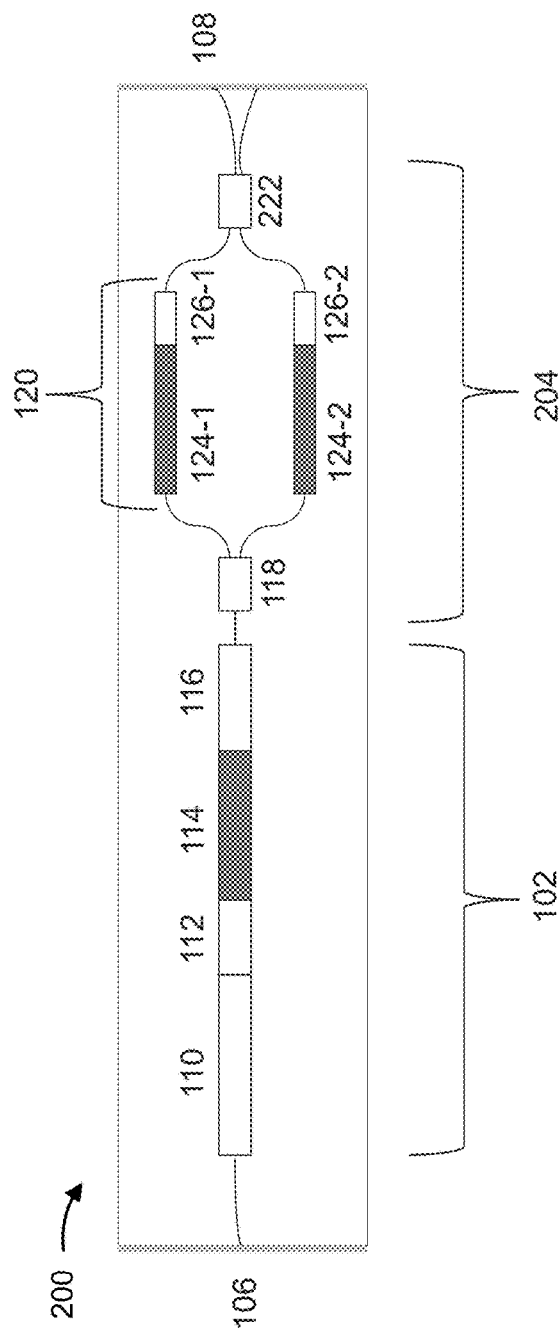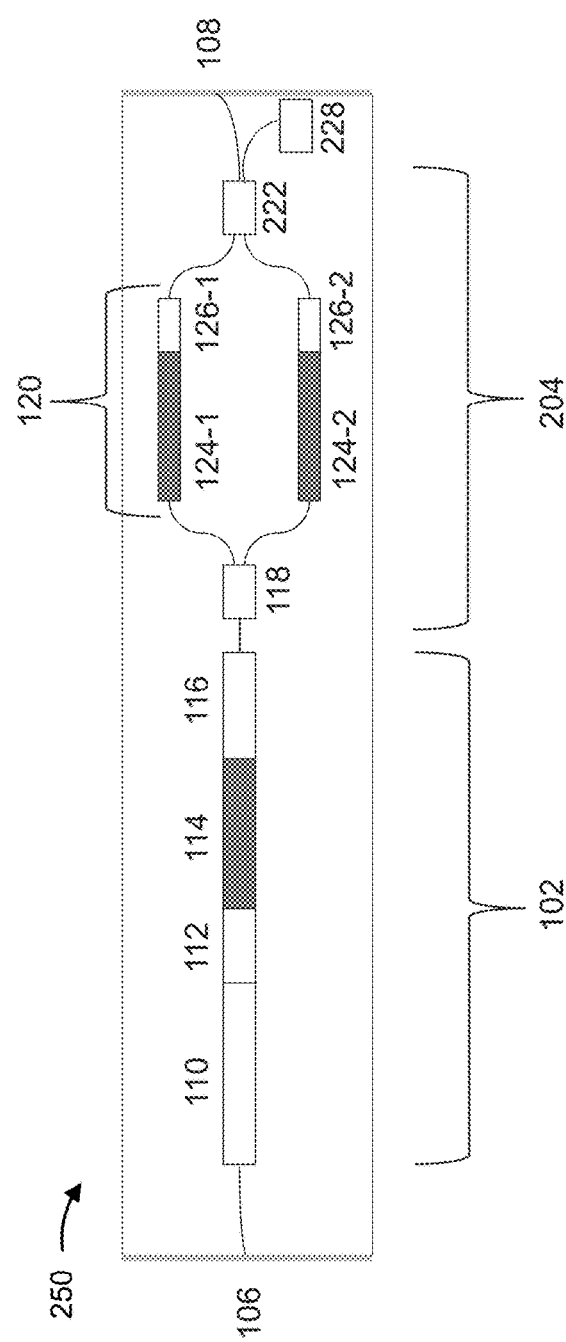

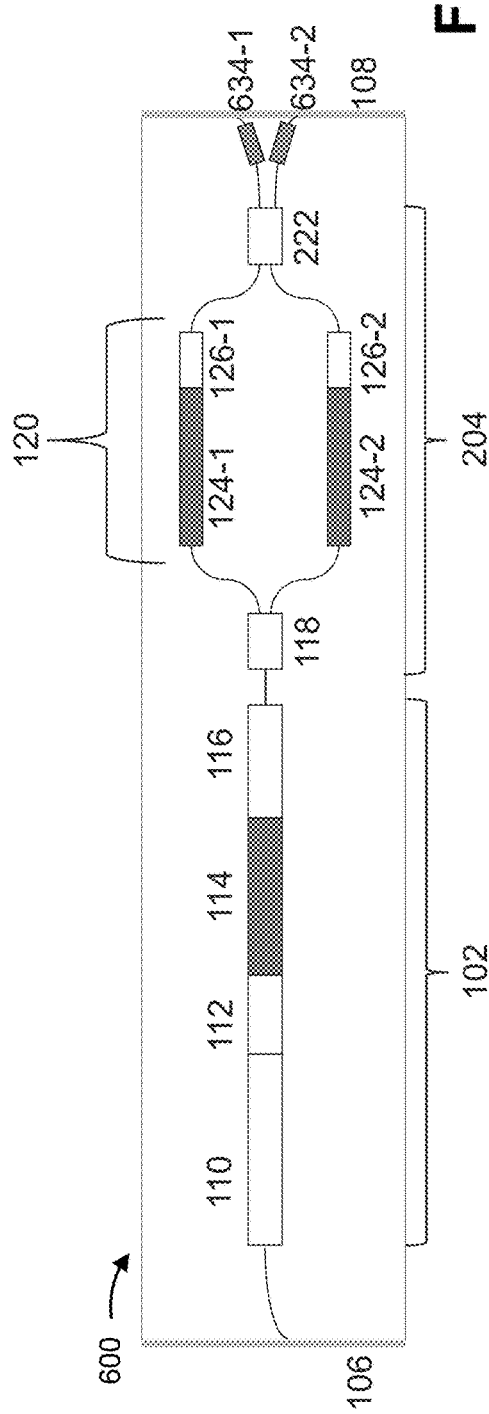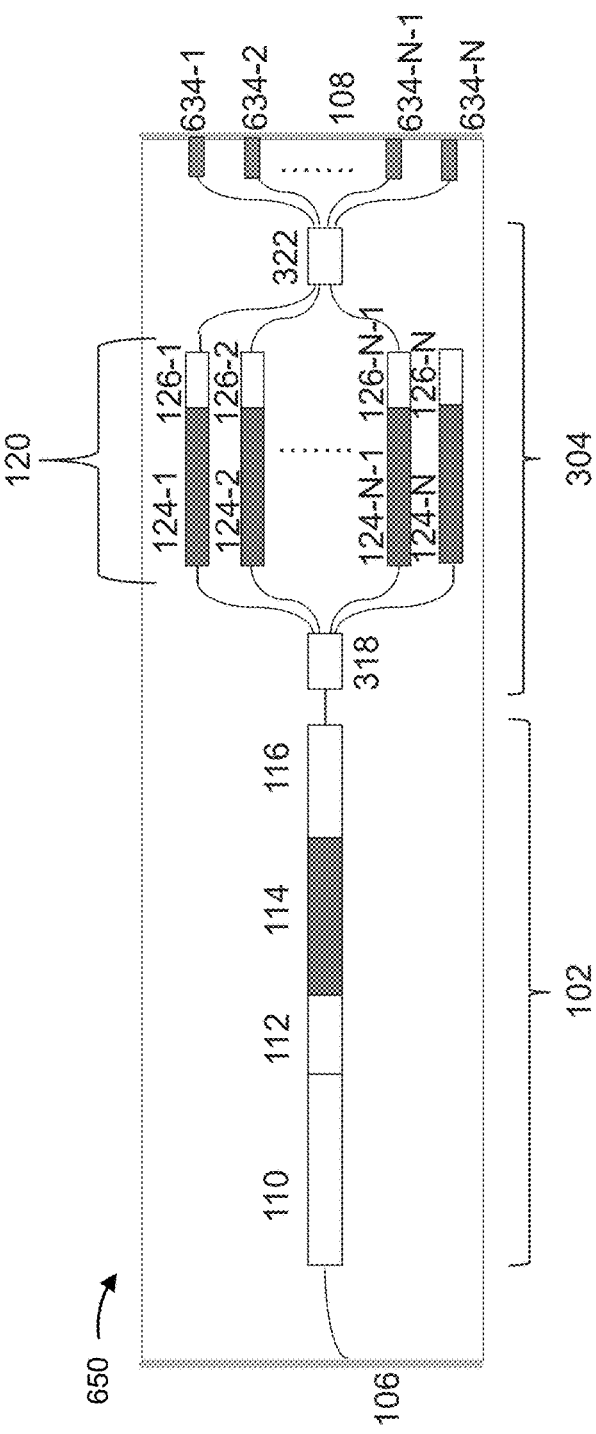

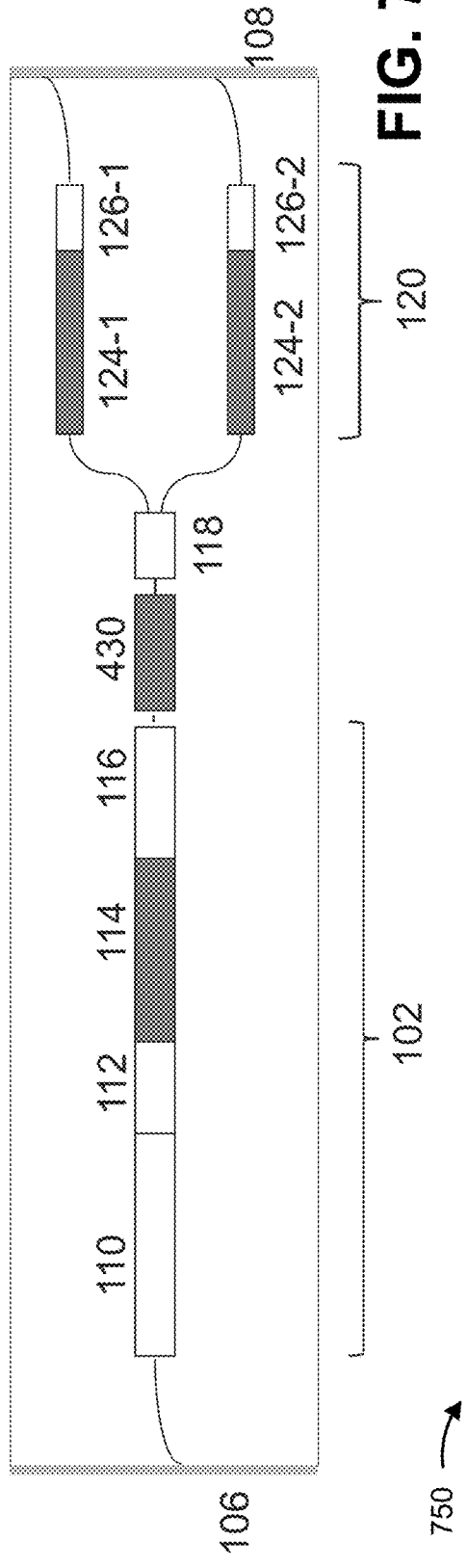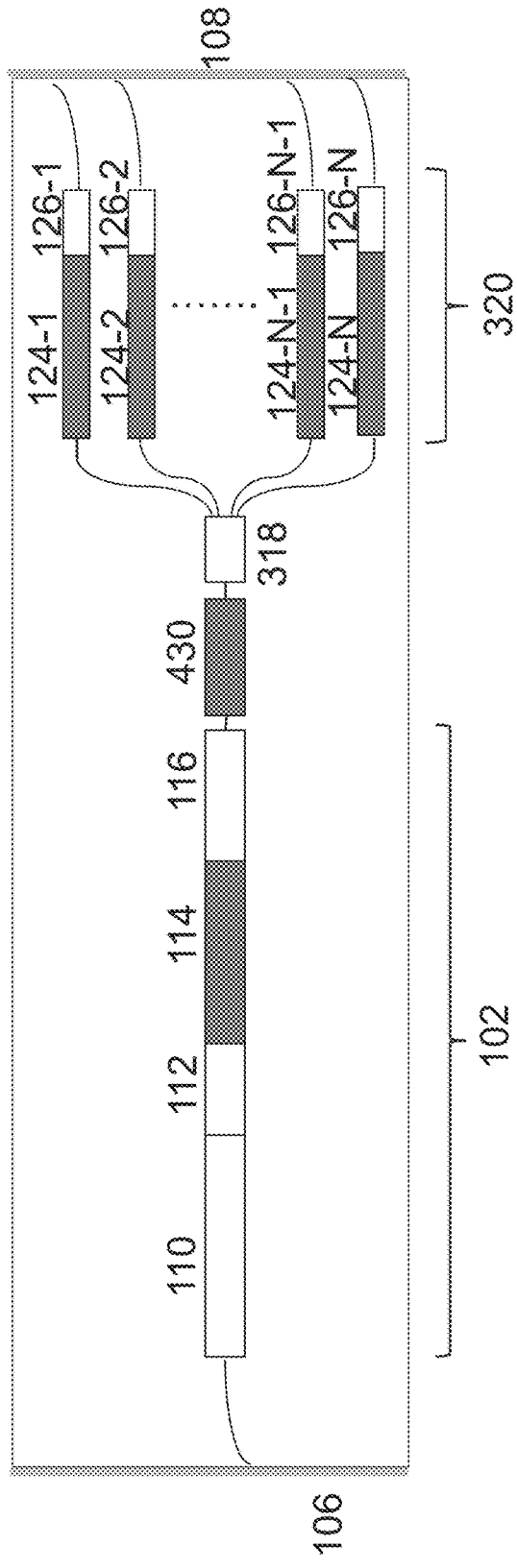

INTEGRATED SEMICONDUCTOR LASER WITH INTERFEROMETRIC AMPLIFIER ARRAY

RELATED APPLICATION(S)

This application claims priority to U.S. Provisional Patent Application No. 62/895,399, filed on Sep. 3, 2019, and entitled "INTEGRATED SEMICONDUCTOR OPTICAL AMPLIFIER FOR SEMICONDUCTOR LASERS," the content of which is incorporated by reference herein in its entirety.

TECHNICAL FIELD

The present disclosure relates to an integrated semiconductor laser with an interferometric amplifier array, and in particular to an integrated semiconductor laser with interferometric amplifier array that utilizes a plurality of semiconductor optical amplifiers.

BACKGROUND

A semiconductor optical amplifier (SOA) may amplify an optical beam that propagates through the SOA to increase an amount of optical power of the optical beam. Amplification may occur in a gain medium of the SOA, which has to be pumped (e.g., provided an electrical current) by an external source.

SUMMARY

According to some implementations, a photonic integrated circuit may comprise a laser configured to generate an optical beam; and a Mach-Zehnder Interferometer (MZI) configured to amplify the optical beam, wherein the MZI comprises a first coupler and a second coupler connected via a plurality of arms of the MZI, wherein an arm, of the plurality of arms, provides an optical path for part of the optical beam and comprises a semiconductor optical amplifier (SOA) configured to amplify the part of the optical beam and a phase shifter configured to adjust a phase of the part of the optical beam.

According to some implementations, a photonic integrated circuit may comprise one or more lasers; and a Mach-Zehnder Interferometer (MZI) connected to the one or more lasers, comprising: a first coupler that comprises at least one input and a plurality of outputs; a semiconductor optical amplifier (SOA) array that comprises a plurality of arms, wherein each arm, of the plurality of arms, comprises an SOA and a phase shifter; and a second coupler that comprises a plurality of inputs and at least one output.

According to some implementations, a photonic integrated circuit may comprise a laser connected to a first coupler; the first coupler connected to a semiconductor optical amplifier (SOA) array; and the SOA array comprising a plurality of arms, wherein each arm, of the plurality of arms, comprises an SOA and a phase shifter.

BRIEF DESCRIPTION OF THE DRAWINGS

FIGS. 1-9 are diagrams of one or more example implementations described herein.

DETAILED DESCRIPTION

Figure 1:
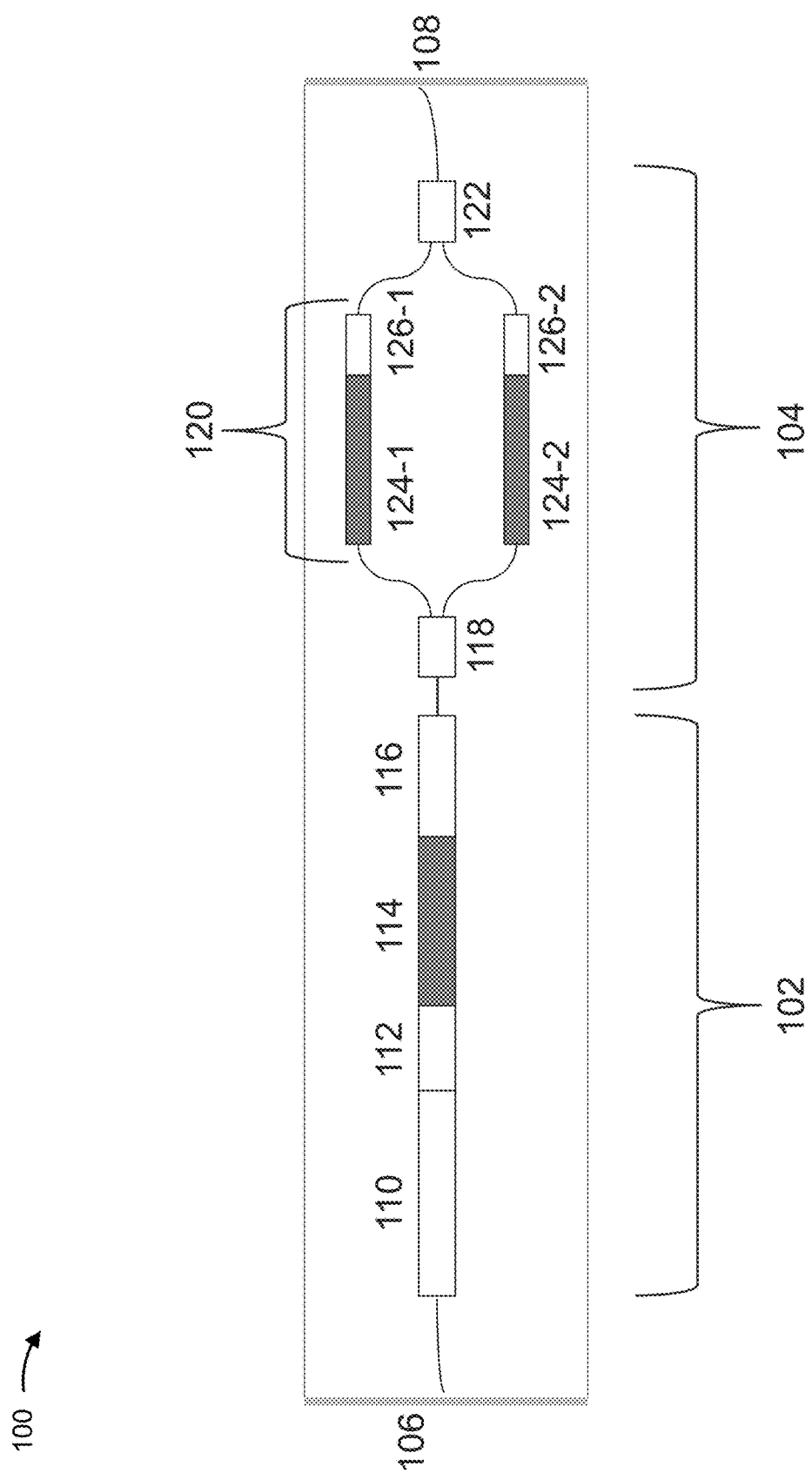

The following detailed description of example implementations refers to the accompanying drawings. The same reference numbers in different drawings may identify the same or similar elements.

A semiconductor integrated laser (e.g., provided in an integrated chip) may be utilized by a coherent frequency modulated continuous wave (FMCW) light detection and ranging (LIDAR) system. However, the FMCW LIDAR system may require a higher optical power output (e.g., 9-10 times higher) than what a typical semiconductor integrated laser produces (e.g., for coherent telecommunications transmission applications). In some cases, an amplifier (e.g., an SOA) may be integrated with the semiconductor integrated laser (e.g., on the same die as the semiconductor integrated laser), but to scale to a higher optical power output, a length and/or an area of the SOA may need to be increased. However, increasing a size of the SOA may change a design of an active layer in the integrated chip (e.g. to maintain chip efficiency, to prevent saturation of the optical power with injected current, and/or the like). This may inhibit the functionality of the integrated chip and/or the FMCW LIDAR system. Additionally, or alternatively, catastrophic failure of either the laser or the amplifier (e.g., in a single-amplifier architecture) may result in a complete loss of function of the integrated chip and/or the FMCW LIDAR system.

Some implementations described herein provide an optical device that includes an integrated laser and an integrated Mach-Zehnder Interferometer (MZI). In some implementations, the optical device may be a photonic integrated circuit that may comprise various semiconducting materials, such as III-V semiconductors (e.g., gallium arsenide (GaAs), indium gallium arsenide (InGaAs), indium gallium arsenide phosphide (InGaAsP), Indium gallium aluminum arsenide (InGaAlAs), indium phosphide (InP), and/or the like), IV semiconductors (e.g., silicon (Si) and/or the like), and/or the like (e.g., as a platform to integrate active and passive photonic circuits with electronic components on a single chip). In some implementations, the MZI may include a first coupler, an amplifier array, and a second coupler. In some implementations, the first coupler may be configured to split an optical beam into a plurality of optical beam parts, wherein each optical beam part propagates through a respective arm, of a plurality of arms, of the amplifier array. In some implementations, an arm may include an amplifier (e.g., an SOA) and/or a phase shifter to amplify and/or adjust a phase of a respective optical beam part. The plurality of optical beam parts (e.g., after being amplified) may propagate to the second coupler, which may recombine the optical beam parts and/or mix the optical beam parts for emission from the optical device.

In this way, the amplifier array described herein may enable scaling to higher optical power output without having to change a design of an active layer of the optical device. Further, the amplifier array may allow for greater fault tolerance of the optical device than an integrated chip that uses a single amplifier. For example, if one amplifier of the amplifier array fails, the optical device may still deliver an output beam (e.g., at a slightly reduced power output). The reduced power output may reduce a detection range of the FMCW LIDAR system, but may otherwise allow the FMCW LIDAR system to continue operating. Moreover, a secondary laser may be included on the same die in the optical device to enable continued operation of the optical device when a primary laser fails.

Additionally, or alternatively, the optical device may provide a plurality of beams as output from the optical device, which may enable a multi-beam FMCW LIDAR system to provide a wide angular scanning range and a high point cloud density. Further, the optical device may provide dynamic reconfigurability of the output power in each beam, of the plurality of beams, which may enable the FMCW LIDAR system to optimize a long distance, narrow field of view or a short distance, wide field of view.

Additionally, or alternatively, the optical device may provide a plurality of beams (e.g., from a plurality of lasers), which may enable a multi-color, multi-beam FMCW LIDAR system to provide concurrent resolution of a distance and speed of a target. Additionally, or alternatively, the optical device may include two lasers of differing wavelength to be coupled to the MZI to allow respective optical beams of the two lasers to be multiplexed into a single output beam without causing a coupling loss (e.g., a 3 decibel (dB) coupling loss).

FIG. 1 is a diagram illustrating a top perspective view of an example optical device 100 described herein. As shown in FIG. 1, the optical device 100 may include a laser 102, a Mach-Zehnder Interferometer (MZI) 104, a back output surface 106, and/or a front output surface 108. The back output surface 106 and the front output surface 108 may each have an antireflective (AR) coating.

In some implementations, the laser 102 and the MZI 104 may be integrated into a substrate of the optical device 100 (e.g., on a single die) and the optical device 100 may be a photonic integrated circuit (e.g., that may comprise various semiconducting materials, such as GaAs, InGaAs, InGaAsP, InGaAlAs, InP, Si and/or the like), a planar lightwave chip, and/or the like that integrates optical components to form the optical device 100.

The laser 102 may be a tunable laser and/or frequency modulated laser. The laser 102 may include a back mirror 110, a phase shifter section 112, a laser gain section 114, a front mirror section 116, and/or the like. The back mirror 110 may include an output that connects to the back output surface 106 of the optical device 100. The front mirror section 116 may include an output that connects to the MZI 104 (e.g., via an input of a first coupler 118 of the MZI 104).

The MZI 104 may include the first coupler 118, an amplifier array 120, a second coupler 122, and/or the like. The first coupler 118 and the second coupler 122 may each be a Multi-Mode Interference (MMI) coupler, a star coupler, a directional coupler, or any other similar type of coupler. The first coupler 118 may include a single input and a plurality of outputs. For example, as shown in FIG. 1, the first coupler 118 may be a 1×2 coupler (e.g., a coupler with one input and two outputs). The input of the first coupler 118 may be connected to the laser 102 (e.g., via the output of the front mirror section 116 of the laser 102). The plurality of outputs of the first coupler 118 may be connected to the amplifier array 120 (e.g., where an output, of the plurality of outputs of the first coupler 118, is connected to an input of an SOA 124, of a plurality of SOAs 124, of the amplifier array 120).

The amplifier array 120 may include a plurality of SOAs 124 and a plurality of phase shifters 126. In some implementations, the amplifier array 120 may include a plurality of arms (e.g., that respectively connect to an output of the first coupler 118 and an input of the second coupler 122), wherein each arm includes an SOA 124 and/or a phase shifter 126 (e.g. joined directly together or joined indirectly together via a waveguide). For example, as shown in FIG. 1, the amplifier array 120 includes two arms, wherein a first arm includes an SOA 124-1 and a phase shifter 126-1 and a second arm includes an SOA 124-2 and a phase shifter 126-2. The SOA 124-1 and the SOA 124-2 may each have an input that connects to a respective output of the first coupler 118. The phase shifter 126-1 and the phase shifter 126-2 may each have an output that connects to a respective input of the second coupler 122. Additionally, or alternatively, the order of the plurality of SOAs 124 and the plurality of phase shifters 126 may be reversed on each arm of the amplifier array 120. For example, the phase shifter 126-1 and the phase shifter 126-2 may each have each have an input that connects to the respective output of the first coupler 118 and the SOA 124-1 and the SOA 124-2 may each have an output that connects to the respective input of the second coupler 122.

The second coupler 122 may include a plurality of inputs and a single output. For example, as shown in FIG. 1, the second coupler 122 may be a 2×1 coupler (e.g., a coupler with two inputs and one output). The plurality of inputs of the second coupler 122 may be connected to the amplifier array 120 (e.g., where an input, of the plurality of inputs of the second coupler 122, is connected to an output of a phase shifter 126, of a plurality of phase shifters 126, of the amplifier array 120). The output of the second coupler 122 may be connected to the front output surface 108.

In some implementations, the laser 102 may be configured to generate an optical beam that may propagate to the first coupler 118 (e.g., via the output of the front mirror section 116 of the laser 102 and the input of the first coupler 118). The first coupler 118 may divide the optical beam into a plurality of optical beam parts. The plurality of optical beam parts may propagate from the first coupler 118 to the amplifier array 120 (e.g., via the plurality of outputs of the first coupler 118 and the respective inputs of the plurality of SOAs 124 of the plurality of arms of the amplifier array 120). The amplifier array 120 may amplify and/or adjust a phase of each optical beam part of the plurality of optical beam parts (e.g., via the respective SOAs 124 and the respective phase shifters 126 of the plurality of arms of the amplifier array 120). The plurality of optical beam parts may propagate from the amplifier array 120 to the second coupler 122 (e.g., via the respective outputs of the plurality of phase shifters 126 of the plurality of arms of the amplifier array 120 and the plurality of inputs of the second coupler 122). The second coupler 122 may combine the plurality of optical beam parts to form a recombined optical beam. The recombined optical beam may propagate from the second coupler 122 to the front output surface 108 (e.g., via the output of the second coupler 122) and then emit from the optical device 100 (e.g., via the front output surface 108).

In some implementations, each phase shifter 126 of the plurality of arms of the amplifier array may be configured to ensure constructive interference of the the plurality of optical beam parts when the plurality of optical beam parts combine to form the recombined optical beam in the second coupler 122. For example, the phase shifter 126-1 may be configured to adjust a phase of a first optical beam part and the phase shifter 126-2 may be configured to adjust a phase of a second optical beam part such that the first optical beam part and the second optical beam part, when propagating to or through the second coupler 122, are additively summed to form the recombined optical beam. The recombined optical beam may have an optical power that is up to 2 times larger than an optical power of any other optical beam part of the plurality of optical beam parts.

As shown in FIG. 1, some components (e.g., components illustrated in FIG. 1 without shading), such as the back mirror 110, the phase shifter section 112, the front mirror section 116, the first coupler 118, the phase shifter 126-1, the phase shifter 126-2, and/or the second coupler 122, may provide a tunable refractive index shift (e.g., phase shift) for the optical beam and/or at least one optical beam part of the plurality of optical beam parts. Additionally, or alternatively, some components (e.g., components illustrated in FIG. 1 with shading), such as the laser gain section 114, the SOA 124-1, and/or the SOA 124-2, may amplify (e.g., provide optical gain to) the optical beam and/or at least one optical beam part of the plurality of optical beam parts. It is recognized that optical amplification may also be accompanied by an optical phase shift, but typically at much smaller amounts than a dedicated phase shifter section of similar geometry.

In some implementations, the laser gain section 114, the SOA 124-1, and/or the SOA 124-2 may be connected to the same electrical power source and may amplify the optical beam and/or at least one optical beam part of the plurality of optical beam parts by the same or a similar amount (e.g., when a same or similar electrical current is provided to the laser gain section 114, the SOA 124-1, and/or the SOA 124-2). Additionally, or alternatively, the laser gain section 114, the SOA 124-1, and the SOA 124-2 may be connected to different electrical power sources and may amplify the optical beam and/or at least one optical beam part of the plurality of optical beam parts by different amounts (e.g., when a different electrical current is respectively provided to the laser gain section 114, the SOA 124-1, and/or the SOA 124-2).

As indicated above, FIG. 1 is provided merely as one or more examples. Other examples may differ from what is described with regard to FIG. 1.

FIGS. 2A-2B are diagrams illustrating a respective top perspective view of example optical devices 200 and 250 described herein. The optical devices 200 and 250 may include the same or similar components as optical device 100. Accordingly, a particular component of the optical devices 200 and 250 may be configured in a same or similar manner as a same or similar component of the optical device 100, as described herein.

As shown in FIGS. 2A-2B, the optical devices 200 and 250 may each include the laser 102 (e.g., as described in relation to FIG. 1) and an MZI 204. The MZI 204 may be similar to the MZI 104 and may include the first coupler 118 and the amplifier array 120 (e.g., as described in relation to FIG. 1), as well as a second coupler 222.

The second coupler 222 may be similar to the second coupler 122 described herein. In some implementations, the second coupler 222 may be an MMI coupler, a star coupler, a directional coupler, or any other similar type of coupler. The second coupler 222 may include a plurality of inputs and a plurality of outputs. For example, as shown in FIG. 2, the second coupler 222 may be a 2×2 coupler (e.g., a coupler with two inputs and two outputs). The plurality of inputs of the second coupler 222 may be connected to the amplifier array 120 (e.g., where an input, of the plurality of inputs of the second coupler 122, is connected to an output of a phase shifter 126, of the plurality of phase shifters 126, of the amplifier array 120).

As shown in FIG. 2A and with reference to the optical device 200, the plurality of outputs of the second coupler 222 may be connected to the front output surface 108 to enable a multi-beam emission from the optical device 200. For example, the second coupler 222 may mix a plurality of optical beam parts (e.g., that propagated to the second coupler 222 via the amplifier array 120, in a similar manner as described herein in relation to FIG. 1) to form a plurality of mixed optical beam parts. The mixed optical beam parts may propagate from the second coupler 222 to the front output surface 108 (e.g., via the plurality of outputs of the second coupler 222) and then emit from the optical device 200 (e.g., via the front output surface 108).

Each output, of the plurality of outputs, of the second coupler 222 may be associated with a respective amount of optical power. As shown in FIG. 2, when the second coupler 222 is a 2×2 coupler (e.g., a coupler with two inputs and two outputs), the second coupler 222 may include a primary output and a complementary output, each associated with a different amount of optical power. The second coupler 222 and/or the phase shifter 126-1 and the phase shifter 126-2 of the amplifier array 120 may be configured to ensure that an amount of output power of a first mixed optical beam part propagating via the primary output and an amount of output power of a second mixed optical beam part propagating via the complementary output conforms to a particular ratio (e.g., the amount of power of the first mixed optical beam is ten times larger than the amount of power of the second mixed optical beam).

As shown in FIG. 2B and with reference to the optical device 250, at least one output of the plurality of outputs of the second coupler 222 may be connected to a monitor photodiode 228. The monitor photodiode 228 may be configured to measure an amount of electrical current associated with the at least one output (e.g., that may indicate an amount of optical power of a mixed optical beam propagating via the at least one output). In some implementations, the monitor photodiode 228 may be used as part of a feedback control loop to minimize an amount of electrical current associated with the monitor photodiode 228, and thereby minimize an amount of optical power of a mixed optical beam propagating via the at least one output. In this way, the monitor photodiode 228 can facilitate minimizing an amount of optical power of a mixed optical beam associated with a complementary output of the second coupler 222 and can therefore facilitate maximizing an amount of optical power associated with a primary output of the second coupler 222.

As indicated above, FIGS. 2A-2B are provided merely as examples. Other examples may differ from what is described with regard to FIGS. 2A-2B.

Figure 3:
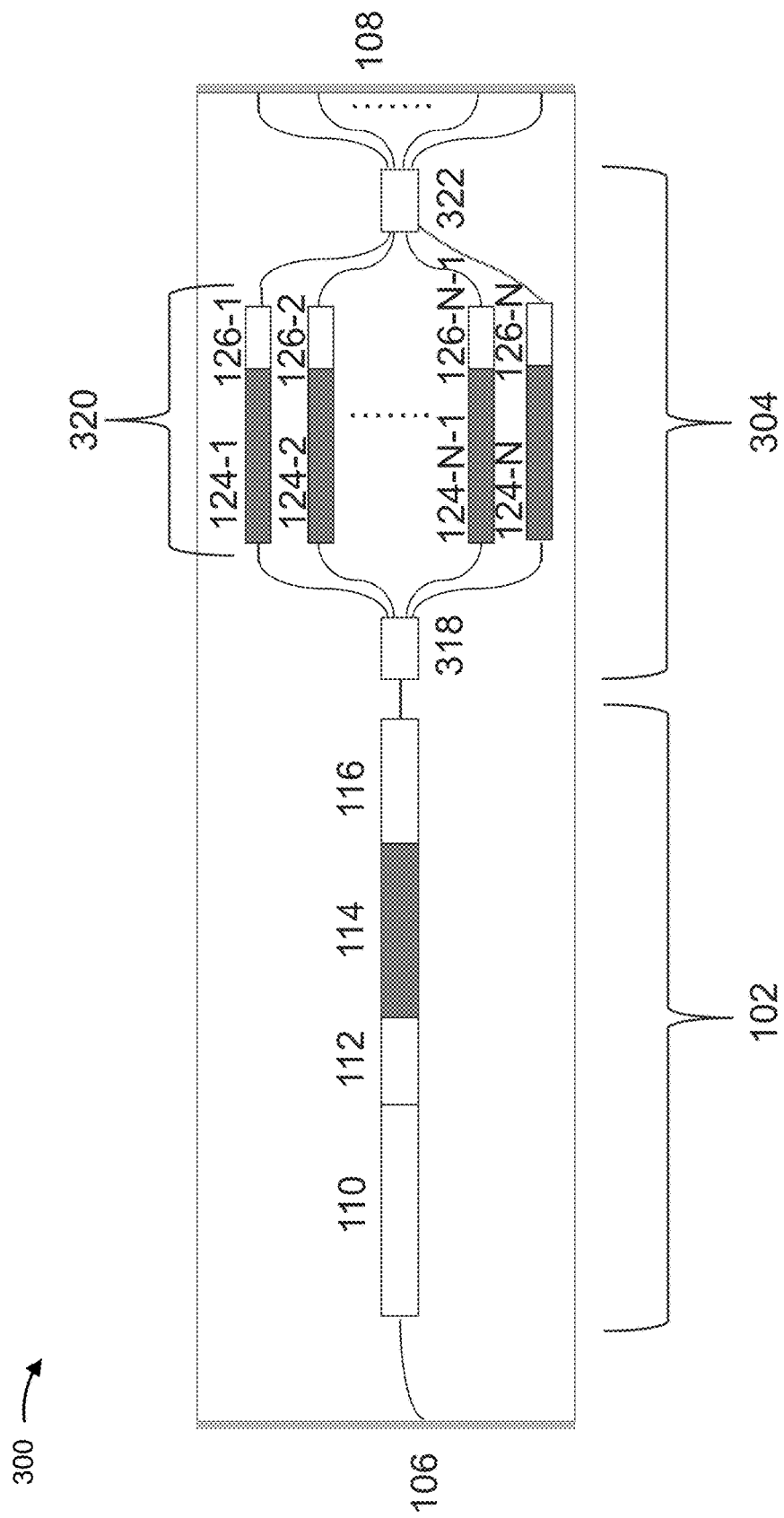

FIG. 3 is a diagram illustrating a top perspective view of an example optical device 300 described herein. The optical device 300 may include the same or similar components as optical devices 100, 200, and/or 250. Accordingly, a particular component of the optical device 300 may be configured in a same or similar manner as a same or similar component of the optical devices 100, 200, and/or 250, as described herein.

As shown in FIG. 3, the optical device 300 may include the laser 102 (e.g., as described in relation to FIG. 1) and an MZI 304. The MZI 304 may include a first coupler 318, an amplifier array 320, and a second coupler 322.

The first coupler 318 may be the same as or similar to the first coupler 118 described herein. In some implementations, the first coupler 318 may be an MMI coupler, a star coupler, a directional coupler, or any other similar type of coupler. The first coupler 318 may include a single input and a plurality of outputs. For example, as shown in FIG. 3, the first coupler 318 may be a 1×N coupler (e.g., a coupler with one input and N outputs), where N is greater than or equal to 2. The input of the first coupler 118 may be connected to the laser 102 (e.g., via the output of the front mirror section 116 of the laser 102). The plurality of outputs of the first coupler 318 may be connected to the amplifier array 320 (e.g., where an output, of the plurality of outputs of the first coupler 318, is connected to an input of an SOA 124, of the plurality of SOAs 124, of the amplifier array 320).

The amplifier array 320 may be the same as or similar to the amplifier array 120 described herein. In some implementations, the amplifier array 320 may include a plurality of SOAs 124 and a plurality of phase shifters 126. In some implementations, the amplifier array 320 may include a plurality of arms (e.g., that respectively connect to an output of the first coupler 318 and an input of the second coupler 322), wherein each arm includes an SOA 124 and/or a phase shifter 126 (e.g. joined directly together or joined indirectly together via a waveguide). For example, as shown in FIG. 3, the amplifier array 320 includes N arms, where N is greater than or equal to 2, and wherein a first arm includes an SOA 124-1 and a phase shifter 126-1 and an $N^{th}$ arm includes an SOA 124-N and a phase shifter 126-N. The SOAs 124-1 through 124-N may each have an input that connects to a respective output of the first coupler 318. The phase shifters 126-1 through 126-N may each have an output that connects to a respective input of the second coupler 322. Additionally, or alternatively, the order of the plurality of SOAs 124 and the plurality of phase shifters 126 may be reversed on each arm of the amplifier array 120. For example, the phase shifter 126-1 through 126-N may each have each have an input that connects to the respective output of the first coupler 318 and the SOAs 124-1 through 124-N may each have an output that connects to the respective input of the second coupler 322.

The second coupler 322 may be the same as or similar to the second coupler 122 and/or the second coupler 222 described herein. In some implementations, the second coupler 322 may be an MMI coupler, a star coupler, a directional coupler, or any other similar type of coupler. The second coupler 322 may include a plurality of inputs and a plurality of outputs. For example, as shown in FIG. 3, the second coupler 222 may be an N×N coupler (e.g., a coupler with N inputs and N outputs), where N is greater than or equal to 2. The plurality of inputs of the second coupler 322 may be connected to the amplifier array 320 (e.g., where an input, of the plurality of inputs of the second coupler 322, is connected to an output of a phase shifter 126, of the plurality of phase shifters 126, of the amplifier array 320). The plurality of outputs of the second coupler 322 may be connected to the front output surface 108 to enable a multi-beam emission from the optical device 300.

In some implementations, the laser 102 may be configured to generate an optical beam that may propagate to the first coupler 318 (e.g., via the output of the front mirror section 116 of the laser 102 and the input of the first coupler 318). The first coupler 318 may divide the optical beam into a plurality of optical beam parts, which may propagate from the first coupler 318 to the amplifier array 320 (e.g., via the plurality of outputs of the first coupler 118 and the respective inputs of the plurality of SOAs 124 of the plurality of arms of the amplifier array 320). The amplifier array 320 may amplify and/or adjust a phase of each optical beam part of the plurality of optical beam parts (e.g., via the respective SOAs 124 and the respective phase shifters 126 of the plurality of arms of the amplifier array 320). The plurality of optical beam parts may propagate from the amplifier array 320 to the second coupler 322 (e.g., via the respective outputs of the plurality of phase shifters 126 of the plurality of arms of the amplifier array 320 and the plurality of inputs of the second coupler 322). The second coupler 322 may mix the plurality of optical beam parts to form a plurality of mixed optical beam parts. The mixed optical beam parts may propagate from the second coupler 322 to the front output surface 108 (e.g., via the plurality of outputs of the second coupler 322) and may emit from the optical device 300 (e.g., via the front output surface 108). Each output of the second coupler 322 may be configured to propagate a mixed optical beam part associated with an optical power amount. In some implementations, a mixed optical beam part emitted via a particular output of the second coupler 322 may have an optical power that is up to N times larger than an optical power of any other mixed optical beam part emitted by the second coupler 322.

As indicated above, FIG. 3 is provided merely as one or more examples. Other examples may differ from what is described with regard to FIG. 3.

Figure 4:
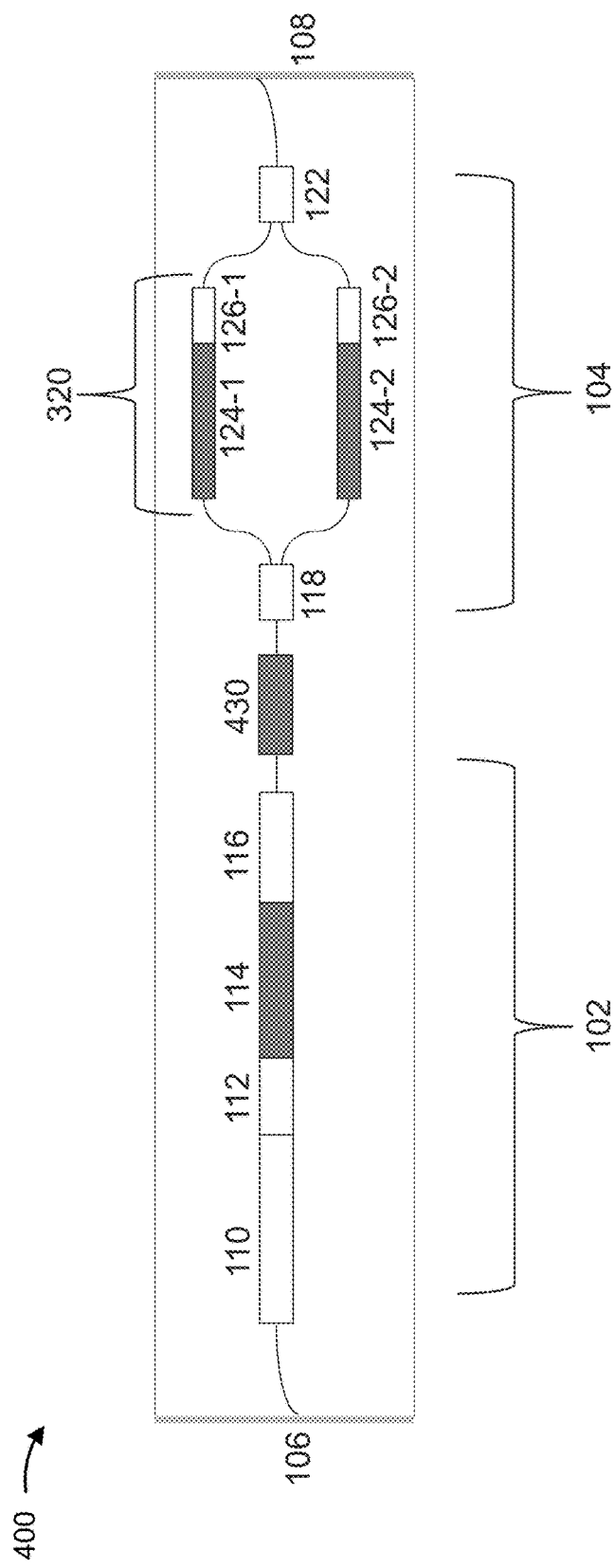

FIG. 4 is a diagram illustrating a top perspective view of an example optical device 400 described herein. The optical device 400 may include the same or similar components as optical devices 100, 200, 250, and/or 300. Accordingly, a particular component of the optical device 400 may be configured in a same or similar manner as a same or similar component of the optical devices 100, 200, 250, and/or 300 as described herein.

As shown in FIG. 4, the optical device 400 may include the laser 102 and the MZI 104 (e.g., as described in relation to FIG. 1). Additionally, the optical device 400 may include an inline SOA 430. The inline SOA 430 may include a single input and a single output. As shown in FIG. 4, the input of the inline SOA may be connected to the laser 102 (e.g., via the output of the front mirror section 116 of the laser 102) and the output may be connected to the MZI 104 (e.g., via the input of the first coupler 118). The inline SOA 430 may be configured to amplify an optical beam generated by the laser 102 when the laser beam is propagating from the laser 102 to the MZI 104. The inline SOA 430 may be connected to the same electrical power source or a different power source as the laser gain section 114, the SOA 124-1, and/or the SOA 124-2, as described herein in relation to FIG. 1.

As indicated above, FIG. 4 is provided merely as one or more examples. Other examples may differ from what is described with regard to FIG. 4.

Figure 5:
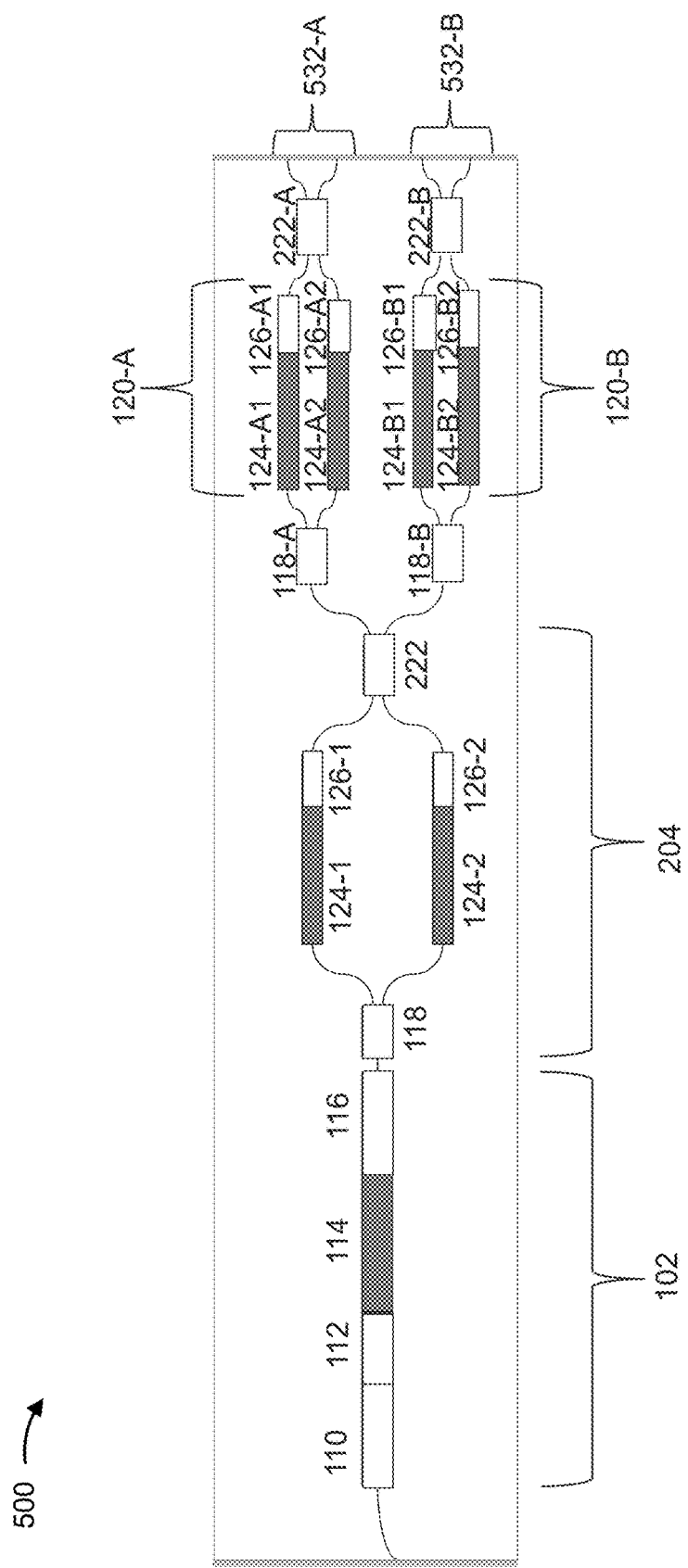

FIG. 5 is a diagram illustrating a top perspective view of an example optical device 500 described herein. The optical device 500 may include the same or similar components as optical devices 100, 200, 250, 300, and/or 400. Accordingly, a particular component of the optical device 500 may be configured in a same or similar manner as a same or similar component of the optical devices 100, 200, 250, 300, and/or 400 as described herein.

The optical device 500 may include the laser 102 (e.g., as described in relation to FIG. 1) and the MZI 204 (e.g., as described in relation to FIG. 2), as well as one or more additional MZIs 532 (e.g., also referred to as one or more cascaded MZIs 532). For example, as shown in FIG. 5, the MZI 204 may be connected (e.g., in parallel) to an additional MZI 532-A and an additional MZI 532-B (e.g., a first output of the second coupler 222 of the MZI 204 is attached to an input of a first coupler 118-A of the additional MZI 532-A and a second output of the second coupler 222 of the MZI 204 is attached to an input of a first coupler 118-B of the additional MZI 532-B).

An additional MZI 532 may be the same as or similar to the MZI 204 and may include the first coupler 118, the amplifier array 120, and the second coupler 222. For example, as shown in FIG. 5, the additional MZI 532-A may include a first coupler 118-A, an amplifier array 120-A (e.g., comprising a first arm that includes an SOA 124-A1 and a phase shifter 126-A1 and a second arm that includes an SOA 124-A2 and a phase shifter 126-A2), and a second coupler 222-A. Additionally, or alternatively, the additional MZI 532-B may include a first coupler 118-B, an amplifier array 120-B (e.g., comprising a first arm that includes an SOA 124-B1 and a phase shifter 126-B1 and a second arm that includes an SOA 124-B2 and a phase shifter 126-B2), and a second coupler 222-B.

As indicated above, FIG. 5 is provided merely as one or more examples. Other examples may differ from what is described with regard to FIG. 4.

FIGS. 6A-6B diagrams illustrating a respective top perspective view of example optical devices 600 and 650 described herein. The optical devices 600 and 650 may include the same or similar components as optical devices 100, 200, 250, 300, 400 and/or 500. Accordingly, a particular component of the optical devices 600 and/or 650 may be configured in a same or similar manner as a same or similar component of the optical devices 100, 200, 250, 300, 400, and/or 500 as described herein.

As shown in FIGS. 6A-6B, the optical devices 600 and 650 may each include the laser 102 (e.g., as described in relation to FIG. 1). As shown in FIG. 6A, the optical device 600 may additionally include the MZI 204 (e.g., as described in relation to FIG. 2). As shown in FIG. 6B, the optical device 650 may additionally include the MZI 304 (e.g., as described in relation to FIG. 3).

As shown in FIG. 6A, with reference to optical device 600, a tap photodiode 634 may be connected to at least one output of the plurality of outputs of the second coupler 222 of the MZI 204. For example, as shown in FIG. 6, a tap photodiode 634-1 may be connected to a first output of the second coupler 222 and a tap photodiode 634-2 may be connected to a second output of the second coupler 222.

Similarly, as shown in FIG. 6B and with reference to optical device 650, a tap photodiode 634 may be connected to at least one output of the plurality of outputs of the second coupler 322 of the MZI 304. For example, as shown in FIG. 6, N tap photodiodes 634 (e.g., tap photodiodes 634-1 through 634-N) may be respectively connected to each output of the N outputs of the second coupler 322.

A tap photodiode 634 may be configured to measure an amount of optical power associated with an output that is connected to the tap photodiode 634 (e.g., by absorbing a small fraction of the optical power of an optical beam part propagating via the output), which may be used as a feedback signal to control settings (e.g., amplification settings, phase settings, and/or the like) of the MZI 204 and/or the MZI 304.

As indicated above, FIGS. 6A-6B are provided merely as examples. Other examples may differ from what is described with regard to FIGS. 6A-6B.

FIGS. 7A-7B are diagrams illustrating a respective top perspective view of example optical devices 700 and 750 described herein. The optical devices 700 and 750 may include the same or similar components as optical devices 100, 200, 250, 300, 400, 500, 600 and/or 650. Accordingly, a particular component of the optical devices 700 and/or 750 may be configured in a same or similar manner as a same or similar component of the optical devices 100, 200, 250, 300, 400, 500, 600 and/or 650 as described herein.

As shown in FIGS. 7A-7B, the optical devices 700 and 750 may each include the laser 102 (e.g., as described in relation to FIG. 1) and/or the inline SOA 430 (e.g., as described in relation to FIG. 4). As shown in FIG. 7A, instead of additionally including an MZI, the optical device 700 may additionally include the first coupler 118 and the amplifier array 120 (e.g., as described in relation to FIG. 1). As shown in FIG. 7B, the optical device 750 may additionally include the first coupler 318 and the amplifier array 320 (e.g., as described in relation to FIG. 3).

As shown in FIG. 7A, with respect to optical device 700, the input of the first coupler 118 may be connected to the output of the inline SOA 430 and each output, of the plurality of outputs, of the first coupler 118 may be respectfully connected to an arm, of the one or more arms, of the amplifier array 120. An arm of the amplifier array 120 may include an SOA 124 and/or a phase shifter 126 (e.g., joined directly together or joined indirectly together via a waveguide). Each phase shifter 126 may include an output that connects to the front output surface 108 of the optical device 700. For example, as shown in FIG. 7A, the inline SOA 430 connects to the first coupler 118 that includes a first output that connects to the first arm of the amplifier array 120 and a second output that connects to the second arm of the amplifier array 120. The first arm includes the SOA 124-1 joined to the phase shifter 126-1, which has an output that connects to the front output surface 108. The second arm includes the SOA 124-2 joined to the phase shifter 126-2, which has an output that connects to the front output surface 108.

In some implementations, with respect to the optical device 700, the laser 102 may be configured to generate an optical beam that may propagate to the inline SOA 430, which may amplify the optical beam. The optical beam may propagate to the first coupler 118 (e.g., via the output of the inline SOA 430 and the input of the first coupler 118). The first coupler 118 may divide the optical beam into a plurality of optical beam parts, which may propagate from the first coupler 118 to the amplifier array 120 (e.g., via the plurality of outputs of the first coupler 118 and the respective inputs of the plurality of SOAs 124 of the plurality of arms of the amplifier array 120). The amplifier array 120 may amplify and/or adjust a phase of each optical beam part of the plurality of optical beam parts (e.g., via the respective SOAs 124 and the respective phase shifters 126 of the plurality of arms of the amplifier array 120). The plurality of optical beam parts may propagate from the amplifier array 120 (e.g., via the respective outputs of the plurality of phase shifters 126 of the plurality of arms of the amplifier array 120) and may emit from the optical device 700 (e.g., via the front output surface 108).

As shown in FIG. 7B, with respect to optical device 750, the input of the first coupler 318 may be connected to the output of the inline SOA 430 and each output, of the plurality of outputs, of the first coupler 318 may be respectfully connected to an arm, of the one or more arms, of the amplifier array 320. An arm of the amplifier array 320 may include an SOA 124 and/or a phase shifter 126 (e.g., joined directly together or joined indirectly together via a waveguide). Each phase shifter 126 may include an output that connects to the front output surface 108 of the optical device 750. For example, as shown in FIG. 7, the inline SOA 430 connects to the first coupler 318 that includes N outputs that respectively connect to each arm of N arms of the amplifier array 320. The first arm includes the SOA 124-1 joined to the phase shifter 126-1, which has an output that connects to the front output surface 108. Further, the $N^{th}$ arm includes the SOA 124-N joined to the phase shifter 126-N, which has an output that connects to the front output surface 108.

In some implementations, with respect to optical device 750, the laser 102 may be configured to generate an optical beam that may propagate to the inline SOA 430, which may amplify the optical beam. The optical beam may propagate to the first coupler 318 (e.g., via the output of the inline SOA 430 and the input of the first coupler 318). The first coupler 318 may divide the optical beam into a plurality of optical beam parts, which may propagate from the first coupler 318 to the amplifier array 320 (e.g., via the plurality of outputs of the first coupler 118 and the respective inputs of the plurality of SOAs 124 of the plurality of arms of the amplifier array 320). The amplifier array 320 may amplify and/or adjust a phase of each optical beam part of the plurality of optical beam parts (e.g., via the respective SOAs 124 and the respective phase shifters 126 of the plurality of arms of the amplifier array 320). The plurality of optical beam parts may propagate from the amplifier array 320 (e.g., via the respective outputs of the plurality of phase shifters 126 of the plurality of arms of the amplifier array 320) and may emit from the optical device 750 (e.g., via the front output surface 108).

As indicated above, FIG. 7 is provided merely as one or more examples. Other examples may differ from what is described with regard to FIG. 7.

Figure 8:
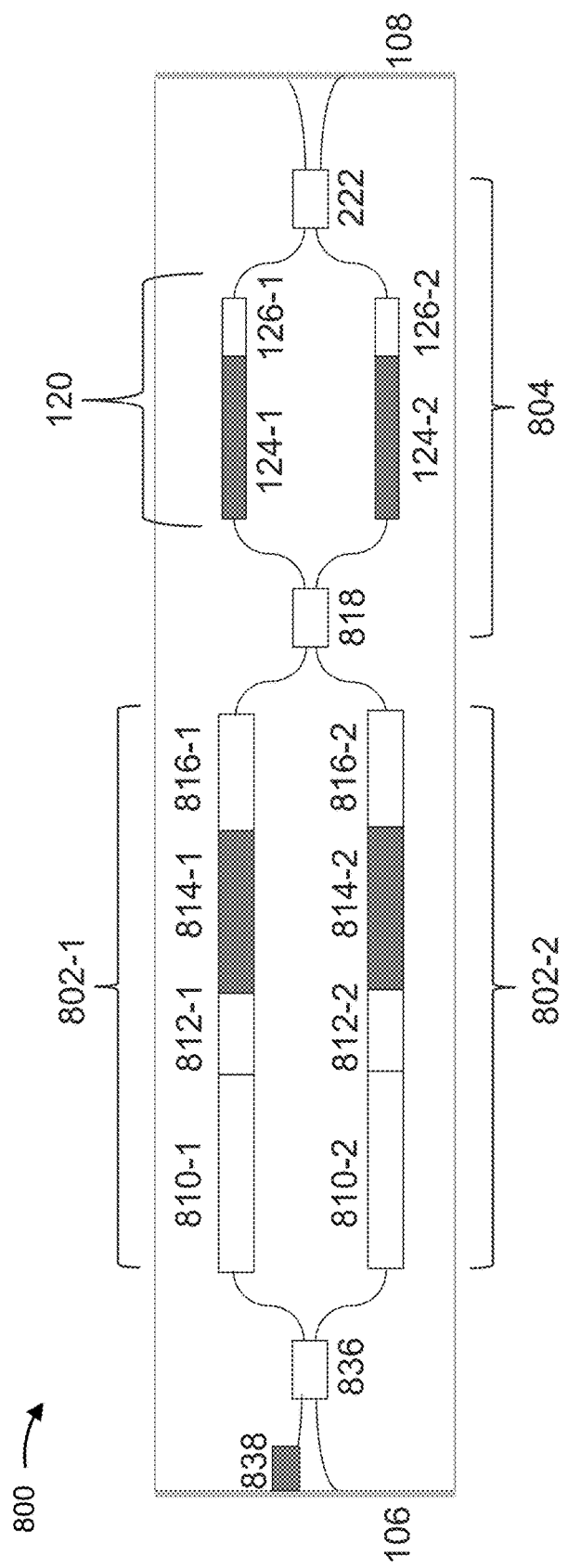

FIG. 8 is a diagram illustrating a top perspective view of an example optical device 800 described herein. The optical device 800 may include the same or similar components as optical devices 100, 200, 250, 300, 400, 500, 600, 650, 700 and/or 750. Accordingly, a particular component of the optical device 800 may be configured in a same or similar manner as a same or similar component of the optical devices 100, 200, 250, 300, 400, 500, 600, 650, 700 and/or 750 as described herein.

As shown in FIG. 8, the optical device 800 may include a laser 802-1, a laser 802-2, and an MZI 804. The laser 802-1 may be the same as or similar to the laser 102 described herein. In some implementations, the laser 802-1 may include a back mirror section 810-1, a phase shifter section 812-1, a laser gain section 814-1, a front mirror section 816-1, and/or the like. The front mirror section 816-1 may include an output that connects to the MZI 804 (e.g., via an input, of a plurality of inputs, of a first coupler 818 of the MZI 804). The back mirror section 810-1 may include an output that connects to a third coupler 836 (e.g. via an input, of a plurality of inputs, of the third coupler 836).

Moreover, the laser 802-2 may be the same as or similar to the laser 102 described herein. In some implementations, the laser 802-2 may include a back mirror section 810-2, a phase shifter section 812-2, a laser gain section 814-2, a front mirror section 816-2, and/or the like. The front mirror section 816-2 may include an output that connects to the MZI 804 (e.g., via an input, of a plurality of inputs, of the first coupler 818 of the MZI 804). The back mirror section 810-2 may include an output that connects to the third coupler 836 (e.g. via an input, of a plurality of inputs, of the third coupler 836).

The MZI 804 may include the first coupler 818, the amplifier array 120, the second coupler 222, and/or the like. The first coupler 818 may be similar to the first coupler 118 described herein. In some implementations, the first coupler 818 may be an MMI coupler, a star coupler, a directional coupler, or any other similar type of coupler. The first coupler 818 may provide a tunable refractive index shift (e.g., phase shift) for one or more optical beam parts that propagate through the first coupler 818. The first coupler 818 may include a plurality of inputs and a plurality of outputs. For example, as shown in FIG. 8, the first coupler 818 may be a 2×2 coupler (e.g., a coupler with two inputs and two outputs). A first input of the first coupler 818 may be connected to the laser 802-1 (e.g., via the output of the front mirror section 816-1 of the laser 802-1). A second input of the first coupler 818 may be connected to the laser 802-2 (e.g., via the output of the front mirror section 816-2 of the laser 802-2). The plurality of outputs of the first coupler 818 may be connected to the amplifier array 120 (e.g., where an output, of the plurality of outputs of the first coupler 818, is connected to an input of an SOA 124, of the plurality of SOAs 124, of the amplifier array 120).

In some implementations, the third coupler 836 may be an MMI coupler, a star coupler, a directional coupler, or any other similar type of coupler. The third coupler 836 may include a plurality of inputs and a plurality of outputs. For example, as shown in FIG. 8, the third coupler 836 may be a 2×2 coupler (e.g., a coupler with two inputs and two outputs). A first input of the third coupler 836 may be connected to the laser 802-1 (e.g., via the output of the back mirror section 810-1 of the laser 802-1). A second input of the third coupler 836 may be connected to the laser 802-2 (e.g., via the output of the back mirror section 810-2 of the laser 802-2). At least one output, of the plurality of outputs, of the third coupler 836 may be connected to the back output surface 106 of the optical device 800. As shown in FIG. 8, at least one output, of the plurality of outputs, of the third coupler 836 may be connected to a monitor photodiode 838. The monitor photodiode 838 may be configured to measure an amount of electrical current associated with the at least one output.

In some implementations, only one laser 802 of the optical device 800 may generate an optical beam at a time. For example, the laser 802-1 may be configured to generate a first optical beam. A first portion of the optical beam may propagate to the MZI 804 to form a plurality of mixed optical beams that are emitted from the optical device 800 (e.g., in a similar manner as described herein in relation to FIGS. 1 and 2). Moreover, a second portion of the optical beam may propagate to the third coupler 836 (e.g., via the output of the back mirror section 810-1 and an input, of the plurality of inputs, of the third coupler 836). The third coupler 836 may divide the second portion of the optical beam into a plurality of optical beam parts and may propagate the plurality of optical beam parts to the plurality of outputs of the third coupler 836. The monitor photodiode 838 that is connected to the at least one output, of the plurality of outputs, of the third coupler 836 may measure an amount of electrical current associated with the at least one output. As long as the monitor photodiode 838 does not detect a fault condition (e.g., as long as the measured amount of electrical current associated with the at least one output of the third coupler 836 satisfies (e.g., is greater than or equal to) a threshold), the laser 802-1 may be configured to generate the first optical beam and/or the laser 802-2 may be configured to be turned off. Additionally, or alternatively, when the monitor photodiode 838 detects a fault condition (e.g., the measured amount of electrical current associated with the at least one output fails to satisfy (e.g., is less than) the threshold), the laser 802-1 may be configured to cease generating the first optical beam (e.g., the laser 802-1 is configured to be turned off) and the laser 802-2 may be configured to generate a second optical beam. The second optical beam may propagate through the optical device 800 in a similar manner as described herein in relation to the first optical beam.

As indicated above, FIG. 8 is provided merely as one or more examples. Other examples may differ from what is described with regard to FIG. 8.

Figure 9:
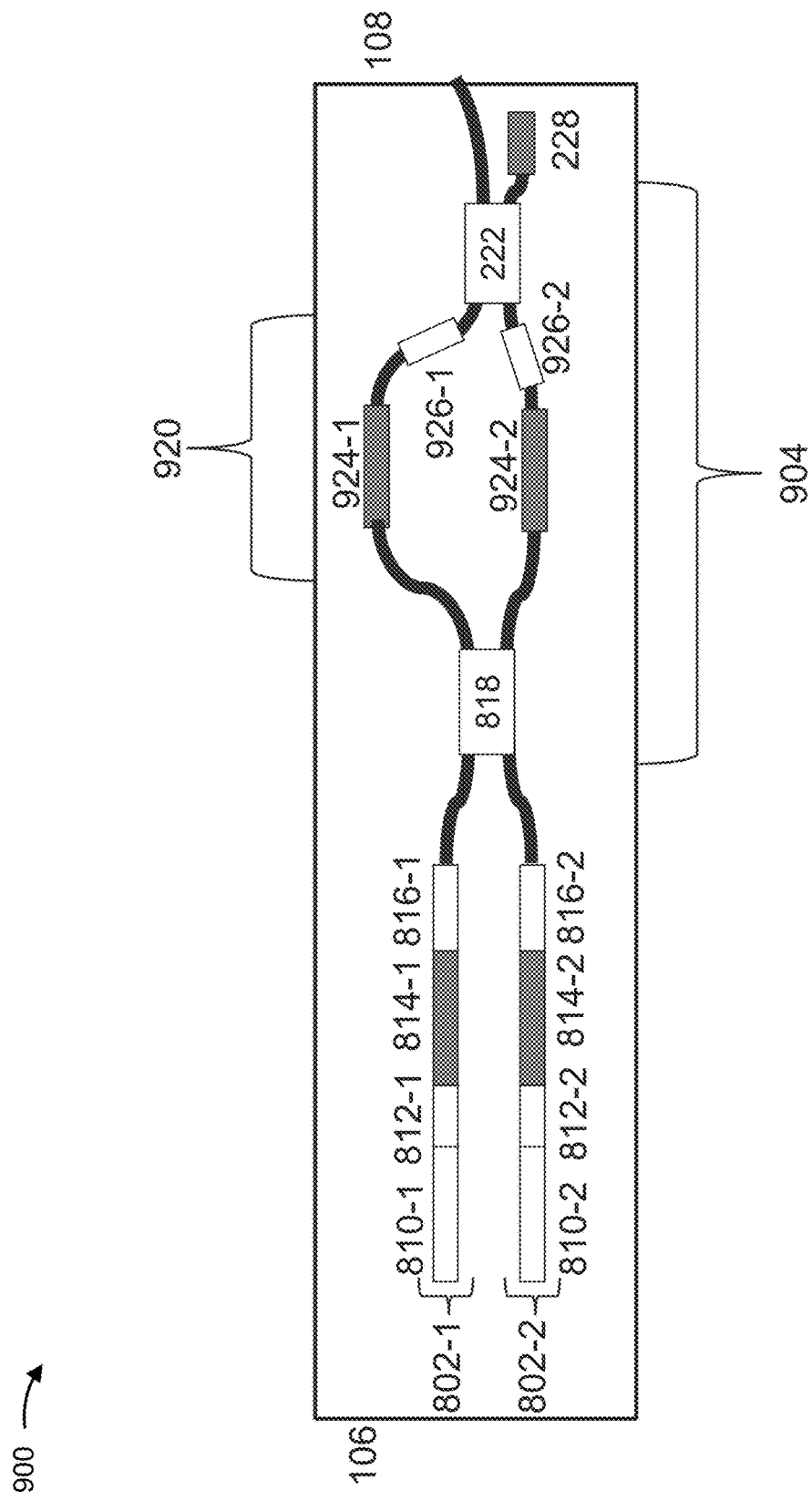

FIG. 9 is a diagram illustrating a top perspective view of an example optical device 900 described herein. The optical device 900 may include the same or similar components as optical devices 100, 200, 250, 300, 400, 500, 600, 650, 700, 750 and/or 800. Accordingly, a particular component of the optical device 900 may be configured in a same or similar manner as a same or similar component of the optical devices 100, 200, 250, 300, 400, 500, 600, 650, 700 750, and/or 800 as described herein.

As shown in FIG. 9, the optical device 900 may include the laser 802-1, the laser 802-2 and an MZI 904. The laser 802-1 may be configured to generate a first optical beam with a first frequency and the laser 802-2 may be configured to generate a second optical beam with a second frequency (e.g., at the same time).

The MZI 904 may include the first coupler 818, an amplifier array 920, the second coupler 222, and/or the like. The amplifier array 920 may be similar to the amplifier array 120 and/or amplifier array 320 described herein. The amplifier array 920 may include a plurality of SOAs 924 and a plurality of phase shifters 926. In some implementations, the amplifier array 920 may include a plurality of arms, wherein each arm connects to a respective output of the first coupler 818 and a respective input of the second coupler 222. Each arm includes an SOA 924 and/or a phase shifter 926 (e.g., joined directly together or joined indirectly together via a waveguide). For example, as shown in FIG. 9, the amplifier array 920 includes two arms, wherein a first arm includes the SOA 924-1 and the phase shifter 926-1 and a second arm includes the SOA 924-2 and the phase shifter 926-2. The SOA 924-1 may have an input that connects to a first output of the first coupler 818 and an output that connects to an input of the phase shifter 926-1. The SOA 924-2 may have an input that connects to a second output of the first coupler 818 and an output that connects to an input of the phase shifter 926-2. The phase shifter 926-1 and the phase shifter 926-2 may each have an output that connects to a respective input of the second coupler 222.

In some implementations, each arm of the amplifier array 920 may be unequal in length to another arm of the amplifier array 920, which may produce an interferometric effect that is periodic in optical frequency and which can be characterized by a free spectral range (FSR) of the MZI 904. In some implementations, the laser 802-1 and the laser 802-2 may be configured to produce the first optical beam and the second optical beam such that a difference between the first frequency and the second frequency has a particular relationship with the FSR of the MZI 904 (e.g., the difference may be 25% of the FSR, 50% of the FSR, 65% of the FSR, and/or the like).

As described herein, the second coupler 222 may include a plurality of outputs, where at least one output is connected to the front output surface 108. In this way, at least a portion of the first optical beam and at least a portion of the second optical beam may be emitted from the optical device 900 (e.g., as a two-color emission). Additionally, or alternatively, at least one output of the plurality of outputs of the second coupler 222 may be connected to the monitor photodiode 228 (e.g., to be used as part of a feedback control loop to minimize an amount of current associated with the monitor photodiode 228, and thereby minimize an amount of power of a sub-beam propagating via the at least one output), as described herein in relation to FIG. 2.

As indicated above, FIG. 9 is provided merely as one or more examples. Other examples may differ from what is described with regard to FIG. 9.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "input," "output," "connection," "arm," and/or the like is intended to be construed as a structure, such as a waveguide, that provides an optical path (e.g., for an optical beam, an optical beam part, and/or the like).

As used herein, the term "component" is intended to be broadly construed as hardware, firmware, and/or a combination of hardware and software.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A photonic integrated circuit, comprising:
a first laser configured to generate a first optical beam,
wherein the first laser comprises a first front mirror section and a first back mirror section;
a second laser configured to generate a second optical beam,
wherein the second laser comprises a second front mirror section and a second back mirror section; and
a Mach-Zehnder Interferometer (MZI) configured to amplify an optical beam of the first optical beam or the second optical beam,
wherein the MZI comprises a first coupler and a second coupler connected via a plurality of arms of the MZI,
wherein an arm, of the plurality of arms, provides an optical path for part of the optical beam and comprises:
a semiconductor optical amplifier (SOA) configured to amplify the part of the optical beam, and
a dedicated phase shifter configured to provide tunable refractive index shift and adjust a phase of the part of the optical beam, wherein the SOA and the dedicated phase shifter are joined within the arm either directly together or indirectly together via a waveguide,
wherein a first input of the first coupler is connected to an output of the first front mirror section,
wherein a second input of the first coupler is connected to an output of the second front mirror section,
wherein an output of the first coupler is connected to an input of the SOA, and
wherein the first laser and the second laser are connected to a third coupler via the first back mirror section and the second back mirror section, wherein an output of the third coupler is connected to a monitor photodiode.

2. The photonic integrated circuit of claim 1, wherein:
the first coupler comprises a plurality of outputs,
wherein the plurality of outputs of the first coupler include the output of the first coupler,
wherein each output, of the plurality of outputs of the first coupler, is connected to a respective arm, of the plurality of arms, of the MZI; and
the second coupler comprises a plurality of inputs and an output,
wherein each input, of the plurality of inputs of the second coupler, is connected to a respective arm, of the plurality of arms, of the MZI, and
wherein the output of the second coupler is connected to an output surface of the photonic integrated circuit.

3. The photonic integrated circuit of claim 1, wherein:
the first coupler comprises a plurality of outputs,
wherein the plurality of outputs of the first coupler include the output of the first coupler, and
wherein each output, of the plurality of outputs, of the first coupler is connected to a respective arm, of the plurality of arms, of the MZI; and
the second coupler comprises a plurality of inputs and a plurality of outputs,
wherein each input, of the plurality of inputs of the second coupler, is connected to a respective arm, of the plurality of arms, of the MZI, and
wherein the plurality of outputs of the second coupler are connected to an output surface of the photonic integrated circuit.

4. The photonic integrated circuit of claim 1, wherein:
the second coupler comprises a plurality of outputs,
wherein at least one output, of the of the plurality of outputs of the second coupler, is connected to a monitor photodiode.

5. The photonic integrated circuit of claim 1, wherein:
the second coupler comprises a plurality of outputs,
wherein each output, of the of the plurality of outputs of the second coupler, is connected to a respective tap photodiode.

6. The photonic integrated circuit of claim 1, wherein the first laser and the MZI are connected via an inline SOA placed between the first front mirror section and the first coupler.

7. The photonic integrated circuit of claim 1, wherein the first coupler and the second coupler are Multi-Mode Interference (MMI) couplers, star couplers, or directional couplers.

8. The photonic integrated circuit of claim 1, wherein the first laser is a tunable laser or a frequency modulated laser, wherein the first laser further comprises a phase shifter section and a laser gain section.

9. A photonic integrated circuit, comprising:
two or more lasers,
wherein the two or more lasers comprise a first laser and a second laser, and
wherein the two or more lasers each comprise a front mirror section; and
a Mach-Zehnder Interferometer (MZI) connected to the two or more lasers, comprising:
a first coupler that comprises at least two inputs and a plurality of outputs;
a semiconductor optical amplifier (SOA) array that comprises a plurality of arms,
wherein each arm, of the plurality of arms, comprises an SOA and a dedicated phase shifter,
wherein the dedicated phase shifter is configured to provide tunable refractive index shift and adjust a phase of an output beam, and
wherein the SOA and the dedicated phase shifter are joined within the arm either directly together or indirectly together via a waveguide; and
a second coupler that comprises a plurality of inputs and at least one output,
wherein the at least two inputs of the first coupler are connected to corresponding outputs of corresponding front mirror sections,
wherein each output, of the plurality of outputs of the first coupler, is connected to an input of a respective SOA of the plurality of arms, and
wherein the first laser and the second laser are connected to a third coupler via respective back mirror sections of the first laser and the second laser, wherein an output of the third coupler is connected to a monitor photodiode.

10. The photonic integrated circuit of claim 9, wherein:
the first coupler is a 2×2 coupler and the second coupler is a 2×1 coupler; or
the first coupler is a 2×2 coupler and the second coupler is a 2×2 coupler.

11. The photonic integrated circuit of claim 9, wherein the at least one output of the second coupler is connected to a tap photodiode or a monitor photodiode.

12. The photonic integrated circuit of claim 9, wherein:
the first laser is configured to generate an optical beam associated with a first frequency; and
the second laser is configured to generate an optical beam associated with a second frequency,
wherein a difference between the first frequency and the second frequency is 50% of a free spectral range of the MZI.

13. The photonic integrated circuit of claim 9, wherein each arm, of the plurality of arms of the SOA array, is configured to have a different arm length than any other arm of the plurality of arms.

14. The photonic integrated circuit of claim 9, wherein the SOA and the dedicated phase shifter, associated with an arm of the plurality of arms of the SOA array, are joined directly together.

15. The photonic integrated circuit of claim 9, wherein:
the first laser is configured to emit a first optical beam, and the second laser is configured to be turned off when the monitor photodiode does not detect a fault condition; or
the second laser is configured to emit a second optical beam, and the first laser is configured to be turned off when the monitor photodiode detects the fault condition.

16. A photonic integrated circuit, comprising:
a first laser connected to a first coupler, wherein:
- the first laser comprises a first front mirror section and a first back mirror section, and
- a first input of the first coupler is connected to an output of the first front mirror section;

a second laser connected to the first coupler, wherein:
- the second laser comprises a second front mirror section and a second back mirror section, and
- a second input of the first coupler is connected to an output of the second front mirror section;

the first coupler connected to a semiconductor optical amplifier (SOA) array that comprises a plurality of arms,
- wherein each arm, of the plurality of arms, comprises an SOA and a dedicated phase shifter,
- wherein the dedicated phase shifter is configured to provide tunable refractive index shift and adjust a phase of an output beam,
- wherein the SOA and the dedicated phase shifter are joined within the arm either directly together or indirectly together via a waveguide, and
- wherein each SOA comprises an input that is connected to a respective output, of a plurality of outputs, of the first coupler;

a second coupler connected to the first coupler via the plurality of arms of the SOA array; and a third coupler, wherein:
- the first laser and the second laser are connected to a third coupler via the first back mirror section and the second back mirror section, and
- an output of the third coupler is connected to a monitor photodiode.

17. The photonic integrated circuit of claim 16, wherein the first laser is connected to the first coupler via an inline SOA placed between the first front mirror section and the first coupler.

18. The photonic integrated circuit of claim 16, wherein a Mach-Zehnder Interferometer (MZI) comprises the first coupler and the SOA array.

19. The photonic integrated circuit of claim 16, wherein the photonic integrated circuit is configured to turn off the first laser or the second laser based at least in part on an output of the monitor photodiode indicating a fault condition with the first laser or the second laser.

20. The photonic integrated circuit of claim 1, wherein the photonic integrated circuit is configured to turn off the first laser or the second laser based at least in part on an output of the monitor photodiode indicating a fault condition with the first laser or the second laser.

* * * * *